US012577683B2

(12) United States Patent
    Lobner et al.

(10) Patent No.: US 12,577,683 B2
(45) Date of Patent: Mar. 17, 2026

(54) COLORATION VIA LASER OXIDATION

(71) Applicant: Kohler Co., Kohler, WI (US)

(72) Inventors: Dustin Lobner, Port Washington, WI (US); Kjerstin Gronski, Milwaukee, WI (US); Cody Schwark, Sheboygan, WI (US)

(73) Assignee: Kohler Co., Kohler, WI (US)

( * ) Notice: Subject to any disclaimer, the term of this patent is extended or adjusted under 35 U.S.C. 154(b) by 5 days.

(21) Appl. No.: 18/218,895

(22) Filed: Jul. 6, 2023

(65) Prior Publication Data

US 2024/0287683 A1     Aug. 29, 2024

Related U.S. Application Data

(60) Provisional application No. 63/447,873, filed on Feb. 23, 2023.

(51) Int. Cl.
| | |
|---|---|
| *C23C 28/00* | (2006.01) |
| *C23C 14/02* | (2006.01) |
| *C23C 14/16* | (2006.01) |
| *C23C 14/58* | (2006.01) |
| *C25D 3/04* | (2006.01) |
| *C25D 5/00* | (2006.01) |
| *C25D 5/34* | (2006.01) |
| *C25D 7/00* | (2006.01) |
| *E03C 1/02* | (2006.01) |
| *B44C 1/22* | (2006.01) |

(52) U.S. Cl.
CPC .......... *C23C 28/321* (2013.01); *C23C 14/028* (2013.01); *C23C 14/16* (2013.01); *C23C 14/5853* (2013.01); *C23C 14/5873* (2013.01); *C23C 28/345* (2013.01); *C25D 3/04* (2013.01); *C25D 5/34* (2013.01); *C25D 5/627* (2020.08); *C25D 7/00* (2013.01); *E03C 1/02* (2013.01); *B44C 1/228* (2013.01)

(58) Field of Classification Search
None
See application file for complete search history.

(56) References Cited

U.S. PATENT DOCUMENTS

| | | | |
|---|---|---|---|
| 6,313,436 | B1 | 11/2001 | Harrison |
| 6,613,161 | B2 | 9/2003 | Zheng et al. |

(Continued)

FOREIGN PATENT DOCUMENTS

| | | |
|---|---|---|
| CA | 2968271 A1 | 6/2016 |
| WO | 2016090496 A1 | 6/2016 |
| WO | 2021259826 A1 | 12/2021 |

OTHER PUBLICATIONS

Gorny, SG et al., "Laser Induced Multicolor Image Formation on Metal Surfaces", Proceedings of SPIE—The International Society for Optical Engineering, Jul. 2010, 8 pages.

(Continued)

*Primary Examiner* — Daniel J. Schleis
(74) *Attorney, Agent, or Firm* — Lempia Summerfield Katz LLC

(57) ABSTRACT

A composition includes a first coating electrolytically or electrolessly deposited on a surface of a fixture, a middle layer on the first coating, and a colored oxide in contact with at least a portion of the middle layer, wherein the middle layer includes two or more of zirconium, chromium, titanium, hafnium, and aluminum.

9 Claims, 14 Drawing Sheets

(56)                   References Cited

U.S. PATENT DOCUMENTS

| | | | |
|---|---|---|---|
| 6,819,349 | B2 | 11/2004 | Mimura et al. |
| 8,123,967 | B2 | 2/2012 | Anton et al. |
| 8,609,202 | B2 | 12/2013 | Koops et al. |
| 9,205,697 | B2 | 12/2015 | Ashtiani et al. |
| 9,375,946 | B2 | 6/2016 | Zhang |
| 10,786,874 | B2 | 9/2020 | Guo et al. |
| 11,389,903 | B2 | 7/2022 | Nashner |
| 11,795,671 | B2 * | 10/2023 | Ukigai ................. E03C 1/0404 |
| 2001/0006737 | A1 * | 7/2001 | Welty ................. C23C 28/3455 |
| | | | 428/667 |
| 2002/0097279 | A1 | 7/2002 | Mimura |
| 2015/0367443 | A1 | 12/2015 | Nashner |
| 2019/0299336 | A1 | 10/2019 | Nashner |
| 2021/0155026 | A1 | 5/2021 | Nashner et al. |
| 2021/0172048 | A1 | 6/2021 | Manasterski et al. |
| 2022/0310863 | A1 | 9/2022 | Guo et al. |
| 2022/0379655 | A1 | 12/2022 | Lavallee et al. |

OTHER PUBLICATIONS

Huagang Liu et al., "Surface coloring by laser irradiation of solid substrates", APL Photonics, May 13, 2019, 14 pages.
Ya. M. Andreeva et al., "Laser coloration of metals in visual art and design", Optical Materials Express, Mar. 1, 2019, 10 pages.
Yan Lu et al., "Nanosecond laser coloration on stainless steel surface", Scientific Reports, Aug. 2, 2017, 8 pages.
Extended European Search Report from European Patent Application No. 24158091.9, dated Aug. 1, 2024, 10 pages.

* cited by examiner

Post Partial
Ablation

S101

Electrolytically depositing a first coating on a surface of the plumbing fixture.

S103

Depositing a second coating supported by the first coating and the surface.

S105

Applying a first laser to ablate a portion of the second coating.

S107

Applying a second laser to create a colored oxide at the ablated portion.

COLORATION VIA LASER OXIDATION

CROSS REFERENCE TO RELATED APPLICATIONS

This application claims priority benefit of Provisional Application No. 63/447,873 filed Feb. 23, 2023, which is hereby incorporated by reference in its entirety.

FIELD

The present application relates to the created of colored indicia on various surfaces using a laser.

BACKGROUND

One example of chrome plating or chromium plating is often applied to brass fixtures such as faucets. Chrome plating may involve electroplating (e.g., electrochemical deposition or electrodeposition) a thin layer of chromium onto a metal object or surface. The electroplating may include one or more processes for providing a metal coating on the brass fixtures through the reduction of cations using a direct electric current. The chromed layer provides corrosion resistance, improves cleaning, and increase surface hardness, all while being aesthetically pleasing.

The chrome plating may also be used as the base layer under physical vapor deposition (PVD) finishes to improve adhesion. PVD may include one or more processes in which a material transitions from a condensed phase to a vapor phase and then back to a thin film condensed phase on the object.

BRIEF DESCRIPTION OF THE DRAWINGS

Exemplary embodiments are described herein with reference to the following drawings, according to an exemplary embodiment.

DETAILED DESCRIPTION

Figure 1:
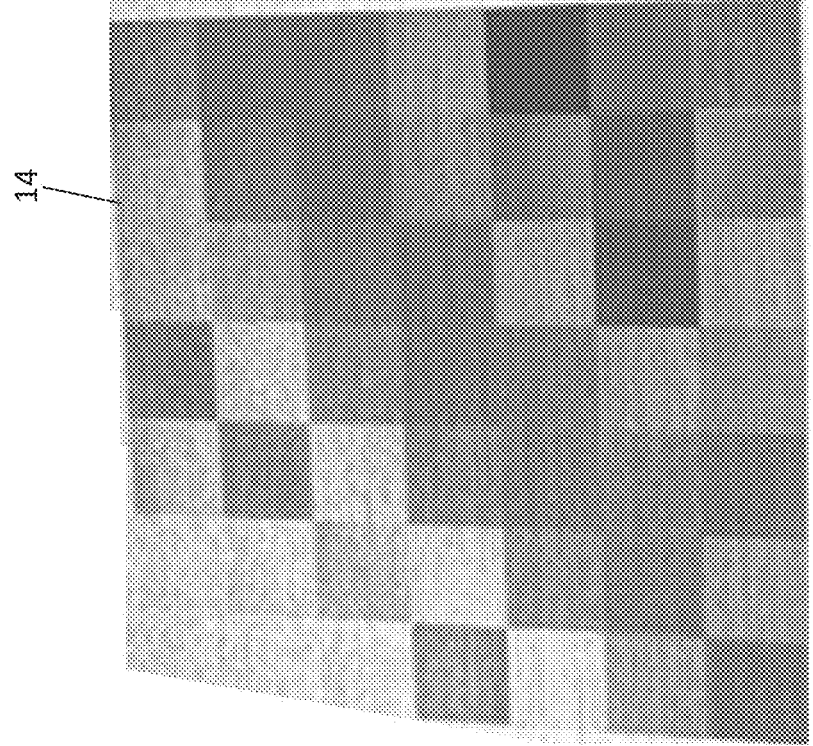
FIG. 1 illustrates example colored indicia.
Figure 1:
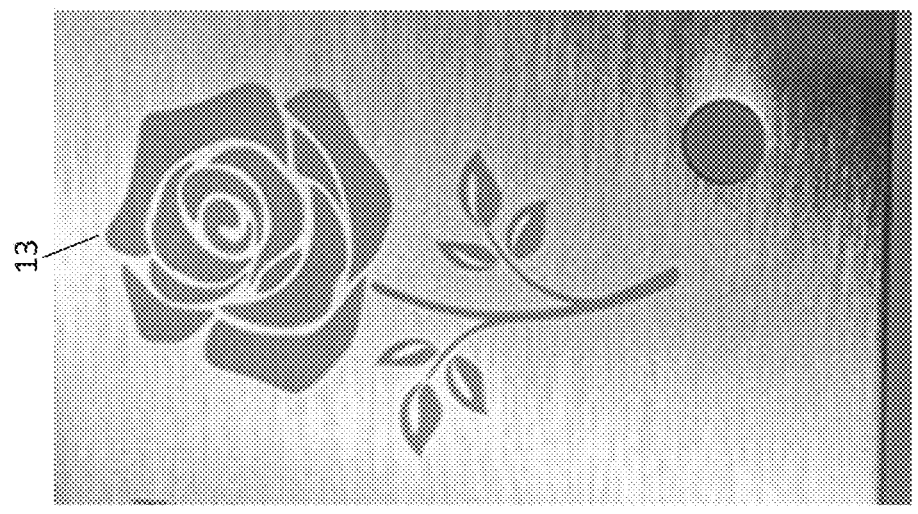

FIG. 1 illustrates example colored indicia formed according to any of the following techniques with the disclosed apparatus. The colored indicia 13 may include a graphic or icon. As a demonstration of the number of distinct colors available, an example colored indicia 13 may include any colors from a color palette 14 is also illustrated. Any of the following texts, images, or other indicia may include any number of colors.

Figure 2:
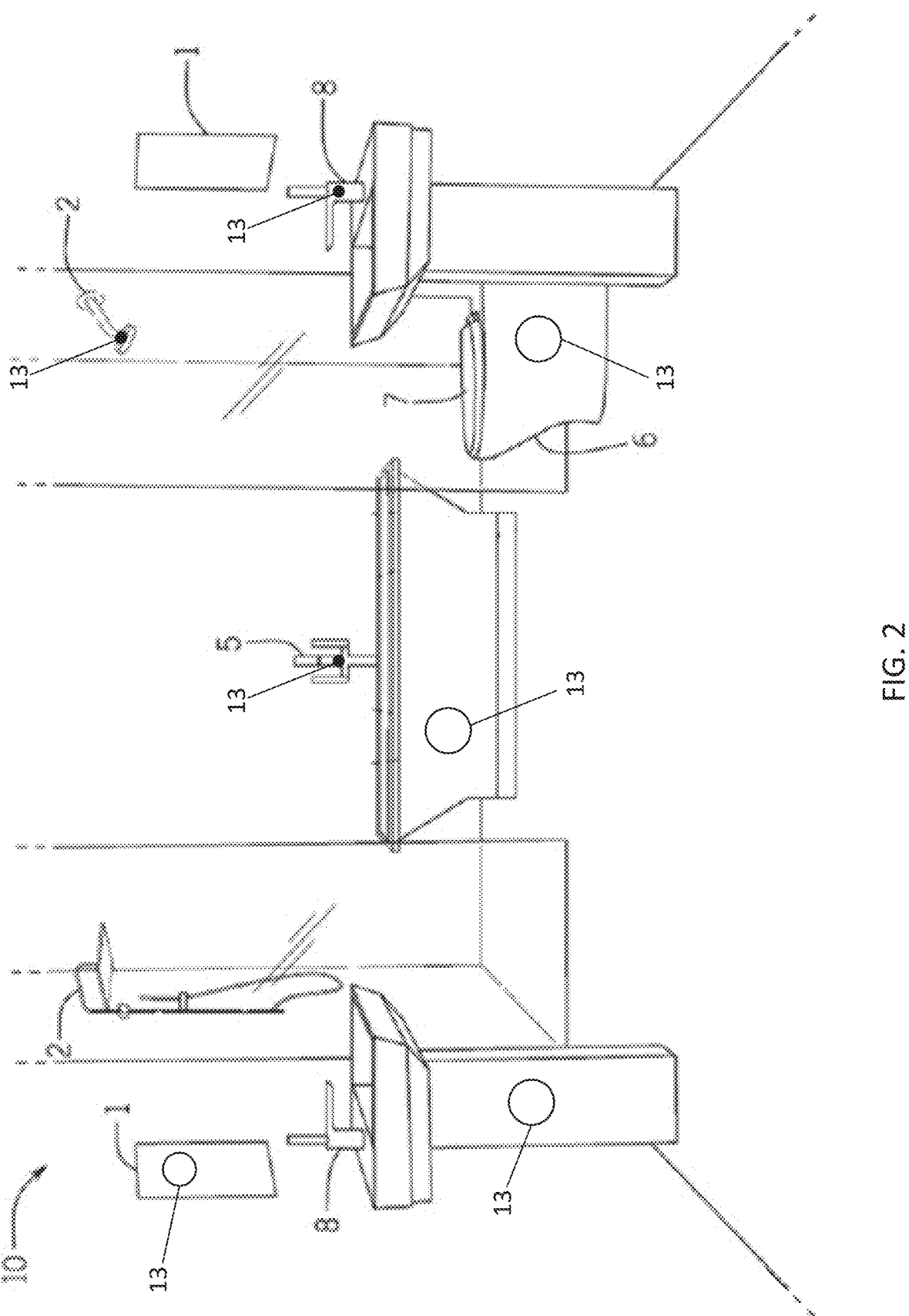
FIG. 2 illustrates example devices for the colored indicia.

FIG. 2 illustrates example devices or parts onto which the colored indicia 13 may be placed in a bathroom setting. The colored indicia 13 may be applied to any surface. The colored indicia 13 may be applied by growing a colored oxide on the surface of the surface.

For example, the following coatings may be placed on, and then colored on, any material that physical vapor deposition or PVD can be applied. These materials include metals, some plastics (such as acrylonitrile butadiene styrene or ABS), glass, and ceramics. The fact that this coating can be applied to many different substrates and should make all the substrates able to be colored with the laser marking process is of critical importance.

Example devices onto which the coatings and colored indicia 13 may be applied in bathroom setting 10 may include at least one bathroom device such as one or more mirrors 1, one or more shower heads 2, a bathtub 3, one or more sinks 4, a bathtub faucet 5, a toilet 6, a toilet seat 7, a sink faucet 8 and other devices. The colored indicia 13 may include a logo, a trademark, or other graphical item or alphanumeric characters indicating the source or manufacturer of the bathroom device. The colored indicia 13 may include graphical item or alphanumeric characters indicative of the user of the device (e.g., names, his or hers, etc.). The colored indicia 13 may include a graphical item or alphanumeric characters that indicates a family or style of devices. The colored indicia 13 may include aesthetic or decorative designs on any of the bathroom devices.

A laser may include an energy source (or pump source), a laser medium, and an optical resonator including two or more mirrors. The laser may be a fiber laser producing a 1064 nm wavelength beam. The laser may be a green laser producing a 532 nm wavelength beam.

The laser used to create the colored oxide decorations with the laser oxide process is a nanosecond pulsed laser. The laser beam is not shining continuously, but is instead pulsed on/off, with the beam off typically >90% (greater than 90%) of the time (less than 10% duty cycle). The duration of the pulses is on the order of 5-250 nanoseconds; hence it being called a nanosecond pulsed laser. The beam is rastered over the part continuously, so the final result is a series of circular or elliptical laser marks on the surface of the part, typically programmed with overlap between the marks so that the surface is continuously covered. The rasterized marks may be circular dots, rows, or other patterns placed closely together to form an image for the colored indicia 13. The duty cycle may be selected according to the size of the rasterized marks. Similarly, the duty cycle may be selected according to a resolution of the colored indicia 13 (i.e., a resolution of the source image of the colored indicia 13).

Many laser parameters can be changed to modify how the laser performs and the resultant color. The total power used may be set as a percentage of maximum power, which is typically on the order of 20-50 watts. The frequency of pulses can be changed and is typically on the order of 20-500 kHz. The raster speed is typically 100-5000 mm/sec. The frequency works in tandem with the raster speed of the laser to effectively increase or decrease the overlap of the laser marks. The same area is typically scanned over multiple times, anywhere from 1-50 cycles depending on the end goal.

The pulse itself can be adjusted on some lasers to be of longer or shorter duration. The spot size of the laser (the diameter of the spot where it hits the surface of the part) cannot be directly adjusted in some examples. Instead, the part is moved up or down relative to the focal plane of the laser spot. This has the effect of bringing the part into focus or out of focus. Perfectly in focus will yield the smallest spot size, and as the part is brought further out of focus the effective spot size increases. Typical "in focus" spot sizes are on the order of 25-250 microns. Moving the part into and out of focus has the impact of changing the power density of the laser; each laser pulse contains the same amount of energy in total, so if the spot size is larger the beam power is spread out more. This lowers the power density delivered.

The focal point of the laser may also be used to create a gradient in the resulting colors. If the focal point of the laser is moved towards or away from the surface of the substrate, the color that is produced changes. One implementation of this affect may involve a laser that is configured to track a curved surface. Tracking the curved surface in three dimensions involves changing the focal point of the laser. If this is applied to a flat surface, a color gradient results. So if the laser is controlled to follow a wavy track but instead a flat surface is used, the focal place will move toward or away from the surface to follow the wavy track (that does not exist). The laser goes in and out of focus and the color that results changes according to the wavy track.

While these examples may be applied to various finishes for faucets or other hardware, other surfaces are possible. The coating and colorization may be applied to faucets or other hardware that are close to being completed. Many faucets or other hardware have either a PVD or chrome plate finish. In PVD, a part may be coated with a thin film of another material. The coating material may be based on a metal, and the substrate can be a variety of materials that are vacuum stable. In some examples, a thin layer of nickel (e.g., nickel strike) may be applied under the chrome plate finish.

The part is placed into a vacuum chamber. Once a vacuum has been reached, a "target" of the metal to be deposited onto the part is evaporated. The evaporation may be performed with electrical arcs, plasmas, or other techniques. This evaporated metal creates a cloud of metal vapor in the vacuum chamber that condenses on the part being coated. This "condensation" forms the thin film coating on the part. Zirconium (Zr) (including naturally occurring hafnium), chromium (Cr), titanium (Ti), and aluminum (Al) may be used as target materials individually or together, creating a mixed-metal coating if desired. Any combination of these target materials are possible. Different material combinations may produce different colors. Example combination pairs include zirconium and chromium, zirconium and titanium, chromium and titanium, zirconium and aluminum, chromium and aluminum and titanium and aluminum. Combinations of three, four or five materials may also be used.

In one example, 25-50% of a first materials above is combined with 25-50% of another one of the materials above and up to 2% of the remaining composition is made of another substance.

During the deposition process, different gases can be added to the PVD chamber that react with the metal being deposited to cause different effects in the final deposited film. In some examples a gas, for example nitrogen ($N_2$ gas), is added, which creates nitrides of the metal and tends to create a yellowing effect to make the part resemble brass or bronze. Acetylene ($C_2H_2$ gas) can be used to add carbon to the film, creating a carbide which tends to darken the appearance of the film. Oxygen gas ($O_2$) can be added to cause other effects. The inclusion of these elements (nitrogen, carbon, and/or oxygen) in the final coating may have an effect on other performance characteristics such as corrosion protection or scratch resistance.

Simple chrome plating may also be used. In this case, chromium metal is electrolytically deposited on a part, which forms a layer that provides both aesthetics and corrosion protection. Chrome plating may also be used as the base layer to improve adhesion.

The laser oxidation coloring process involves moving a laser over the part being colored. The laser parameters are set by a user and/or a controller such as the controller 301 in FIG. 7. The laser parameters may include one or a combination of power, scan speed, number of passes, pulse rate frequency, pulse duration, and repetitions. The laser parameters are adjusted by the user and/or controller so that the laser oxidizes the surface of the part.

This is different than traditional laser marking. In traditional laser marking, the amount of power applied is tailored to burn, cut, or otherwise alter the base material to provide a contrasting visual mark (black or brown on metals being typical).

In the colored oxidation process, the material is locally heated with a laser pulse to cause the metals on the surface to react with oxygen in the atmosphere, forming metallic oxides. These metallic oxides have color of their own which becomes a component of the color observed. The oxide film itself is also typically transparent or translucent. Typically the thickness is similar to the wavelength of visible light (hundreds of nanometers). This provides a structural color effect, the results of which are twofold. First, the color seen will be impacted by the thickness of the film as the film will tend to refract light of the same wavelength as its thickness. Secondly, the color observed displays an iridescent effect, meaning that it changes appearance depending on the angle of observation.

These two features (the intrinsic color of the film based on oxide chemistry and the thickness of the transparent/translucent film) combine to form a film that typically has a vibrant/bright appearance that also changes brightness depending on the angle that the observation is made from.

The intrinsic color of the material is based on a summation of the colors of the oxides present, weighted by how much of each is present. There are two types of oxides formed: metallic oxides and spinel group oxides. The metallic oxides includes examples of the formulas MO, $M_3O_4$, and $M_2O_3$, where M is any metallic element. These oxides have a single color based on the oxidation state of the metal. Red rust on car bodies is an example of this type of oxide, having the formula $Fe_2O_3$. A spinel group oxide is a compound of the formula $AB_2O_4$. "A" is a metallic species in a 2+ valence state, "B" is a metallic species in a 3+ valence state. A and B don't have to be all the same element within themselves, meaning that that a material like $(Mn_wFe_x)(Zr_yCr_z)_2O_4$ is possible, provided that (w+x)=1 and (y+z)=1. The intrinsic color varies depending on the elements present and the quantities of each (using the example above, the exact values of w, x, y, and z will determine the color of that spinel compound). The ability to change the color of the resulting oxide is a function of the formation of spinel groups and the alteration of the chemistry of those spinel group compounds.

As previously stated, spinel groups are compounds with the formula $AB_2O_4$, where A and B are metallic elements (A with 2+ valence state and B with 3+ valence state), and where A and B can be made up of mixtures of different elements, provided they can maintain a 2+ or 3+ valence state. Example elements include zirconium, chromium, titanium, hafnium, and aluminum. The coating may include a composition having A % Zirconium, B % chromium, C % titanium, D % Hafnium, and E % Aluminum, where A, B, C, D, and E are each 0% to 100% and A+B+C+D+E=100% (excluding elements present unintentionally or present as trace amounts). In another example, A, B, C, D, and E are each between a minimum value and a maximum value and A+B+C+D+E=100%. Examples for the minimum value include values greater than 5%. Example for the maximum values include values less than 80%.

This coating is designed for extra performance in oxide coloration by laser in addition to the usual performance requirements of a faucet coating. It should be noted that hafnium may be added but may be naturally included as being inseparable from zirconium in certain examples.

In one example, such a specialty PVD finish may include zirconium and chromium with no nitrogen or carbon and deposited on the surface of the part. This example coating provided the entire color palette. The example coating may include different ratios of chromium to zirconium, such as 1:1 or within the range of 1:2 to 2:1 or within the range of 0.2:1 to 5:1.

The coating can be applied and colored on any material that can receive the PVD process, including metals, some plastics, glass and ceramic. The fact that this coating can be applied to many different substrates and should make all the substrates able to be colored with the laser marking process is of critical importance.

Figure 3:
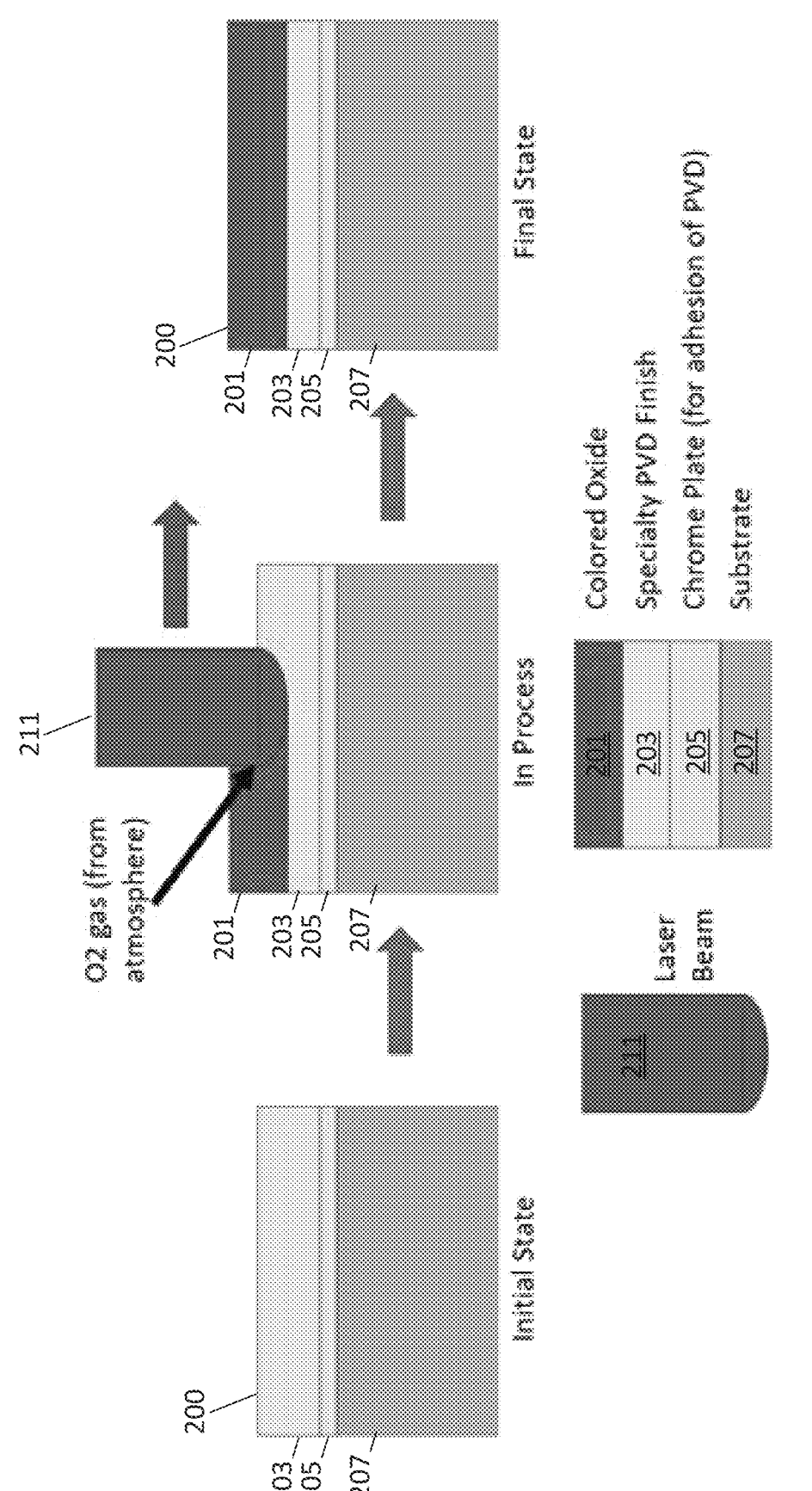
FIG. 3 illustrates an example oxide colorization technique.

FIG. 3 illustrates an example oxide colorization technique for part 200 using laser 211. The part 200, or surface thereof, originally is shown in an initial state including a specialty PVD finish 203, a chrome plating 205, and a substrate 207. The laser oxidation process adds colored oxide 201. The part 200, or surface thereof, arrives at the final state after the laser oxidation process. Additional, different, or fewer components, compounds, or coatings may be included.

The substrate 207 may be an outer surface of a bathroom or kitchen device including at least one plumbing fixture. The substrate 207 may be a surface of the bathroom or kitchen device including stainless steel, aluminum, ceramic, vitreous, tile, or another material.

The chrome plating 205 may be deposited on the substrate 207. The chrome plating 205 may be deposited using electroplating, electrochemical deposition, or electrodeposition to deposit the coating of chromium on the substrate 207. The electroplating may include one or more processes for providing a metal coating on the stainless steel fixtures through the reduction of cations using an electric current. The chrome plating 205 may also be electrolytically deposited on the substrate 207.

The specialty PVD finish 203 may be placed over the chrome plating 205 using PVD. The specialty PVD finish 203 includes at least two metals. In one example, the specialty PVD finish 203 includes zirconium and chromium. In another example, the specialty PVD finish 203 includes zirconium, chromium, titanium, and hafnium. One more additional gases may be added to the PVD process (e.g., in the chamber) when depositing of the specialty PVD finish 203. In addition, one or more chamber properties may be adjusted for the chamber for the PVD process. The colored oxide 201 may be placed on the specialty PVD finish 203 using the laser 211.

Figure 4:
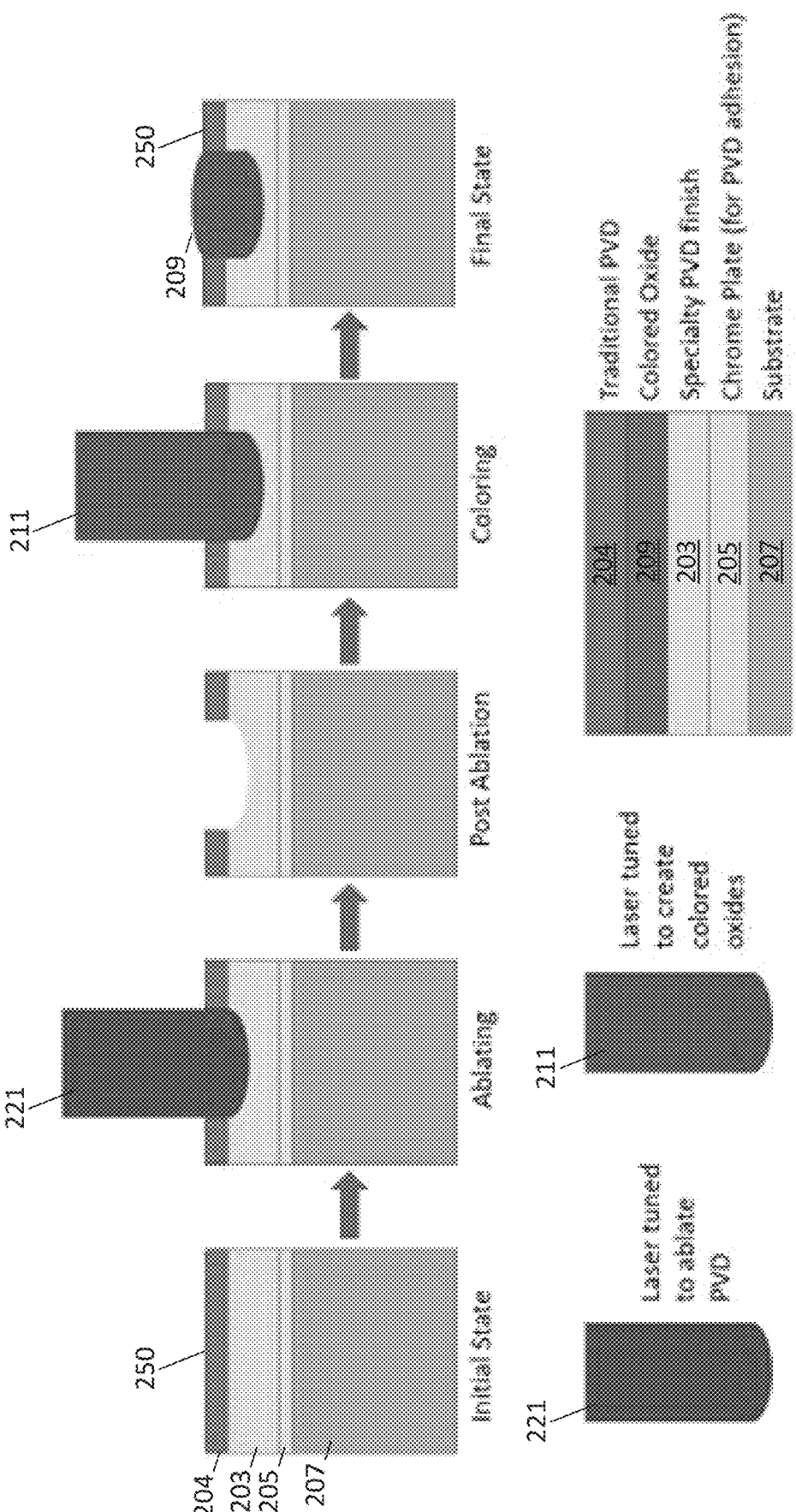
FIG. 4 illustrates another example oxide colorization technique including ablation.

FIG. 4 illustrates an example oxide colorization technique for part 250 using laser 211 and laser 221. In some examples, different devices are used for the lasers 211 and 221. In some examples, the same laser device is used for the lasers 211 and 221. In either case, the laser 211 is tuned to create laser oxides and the laser 221 is tuned to ablate PVD.

The part 250, or surface thereof, originally is shown in an initial state including a bilayer PVD coating including a specialty PVD finish 203 and an outer PVD layer 204. Placed before the bilayer PVD coating, is chrome plating 205, which is applied directly to the substrate 207 of the part. In one phase, the laser ablation process removes a portion of the bilayer PVD coating, and in the next phase the laser oxide process adds colored oxide 201 only to the ablated part of the bilayer PVD coating. The part 200, or surface thereof, arrives at the final state after the laser oxidation process. The chrome plating 205 is optional (e.g., chrome plating may be omitted on stainless but used on brass and ABS). Additional, different, or fewer components, compounds, or coatings may be included.

During the ablating process, the laser 221 evaporates or removes portions of the (top) outer PVD layer 204. A pattern that is ablated from layer 204 may be determined based on commands for the laser 221 received from controller 301. The commands may specify a duty cycle or intensity for the laser beam. The commands may specify locations or coordinates in a 2D or 3D frame of reference for the surface of the part. The commands may include an image file or mask. The image file or mask may be applicable for a single color in the final image. The ablation process may remove all of the layer 204 at the portions indicated in the commands. The ablation may remove a portion of specialty PVD finish 203 at those locations to provide a predetermined surface for the subsequent oxide coloring process. The ablation process may be designed to expose a sufficient are of the specialty PVD finish 203 to complete the subsequent oxide coloring process. Note that the layer 204 and portions of the specialty PVD finish 203 is only ablated in areas designated for coloring, so that the traditional color and PVD finish is maintained elsewhere on the part.

During the oxide coloring process, the laser 211 creates a colored oxide at the ablated portion. The positioning of the color oxide may be based on the same of different commands used in the ablation process. The commands for the laser 211 received from controller 301 may specify a duty cycle or intensity for the laser beam. The commands may specify locations or coordinates in a 2D or 3D frame of reference for the surface of the part. The commands may specify a color for the color oxide at different positions on the surface of the part. The commands may include an image file or mask. The image file or mask may be applicable for a single color in the final image. The oxide coloring process may be repeated for each color in the image to be placed on the part.

The intrinsic color of the material is based on a summation of the colors of the oxides present, weighted by how much of each is present. For each position of the color oxide (e.g., each portion in the image to placed on the part), the controller 301 may specify the type of oxide to be formed. In each instance, a metallic oxide or a spinel group oxide may be selected. In some examples, both are selected. The metallic oxides include metallic elements. Metallic oxides have a single color based on the oxidation state of the metal. Spinel group oxides, having the formula $AB_2O_4$ with "A" being a metallic species in a 2+ valence state, and "B" is a metallic species in a 3+ valence state. The intrinsic color for spinel group oxides varies depending on the elements present and the quantities of each.

Figure 5:
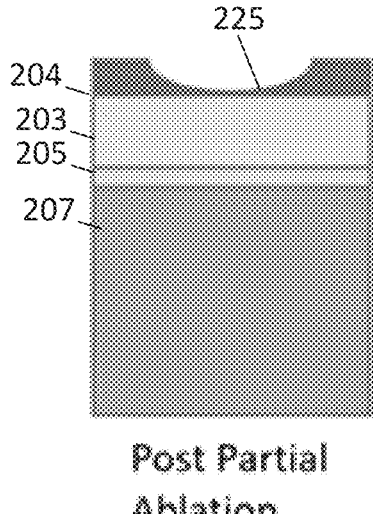
FIG. 5 illustrates another example oxide colorization technique including partial ablation.

FIG. 5 illustrates another example oxide colorization technique including partial ablation. Partial ablation the components and sequences FIG. 4 except that the laser 221 only partially ablates the PVD layer 204. At the region that is ablated, a predetermined thickness 225 of the PVD layer 204 remains. In one example, approximately 80% of the PVD layer 204 is ablated and approximately 20% remains, as shown in FIG. 5. Other proportions may be used.

The coloration of the decorative PVD layer 204 is caused by contamination (carbon, nitrogen, and oxygen) intentionally added to the PVD film. These contaminants cause the laser created oxides to be darker in color if the decorative PVD film is colored directly. As noted above, the ablation may substantially entirely remove the PVD layer 204, revealing the special PVD layer 203 underneath, which provides the brightest colors. For darker colors (e.g., less vibrant or less bright colors), the PVD layer 204 may be partially ablated, leaving behind some of the decorative PVD which contains carbon, nitrogen, and oxygen. When the laser coloring process is completed, the carbon, oxygen, and nitrogen may be mixed with the special PVD layer 203, darkening the resulting colored oxide. By ablating more or less of the PVD layer 204, varying levels of darkening in the resulting colored oxide can be achieved.

Figure 6:
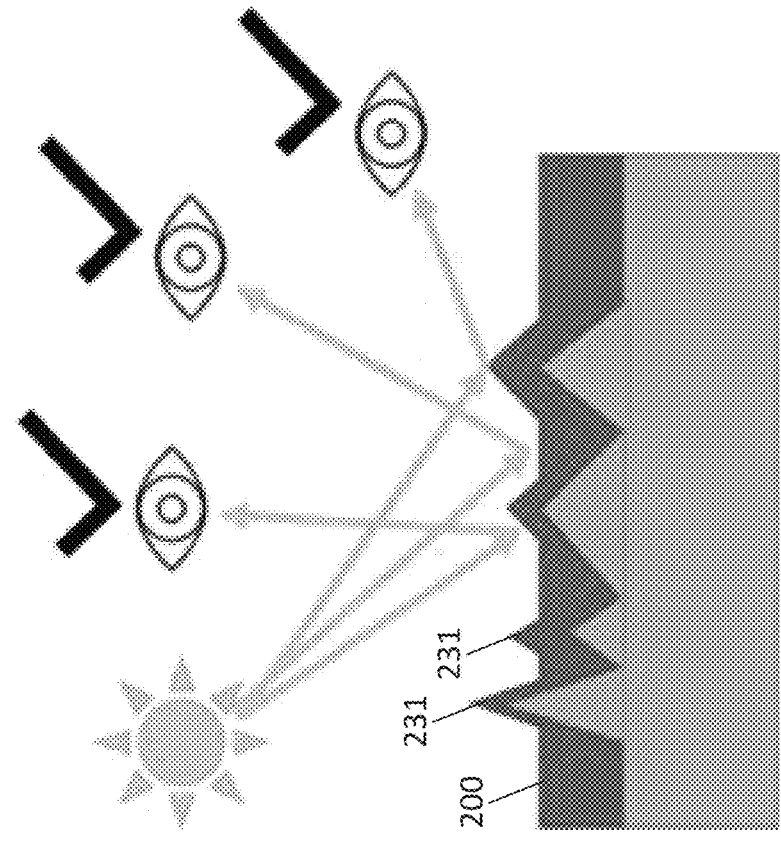
FIG. 6 illustrates surface roughness differences and light reflection.
Figure 6:
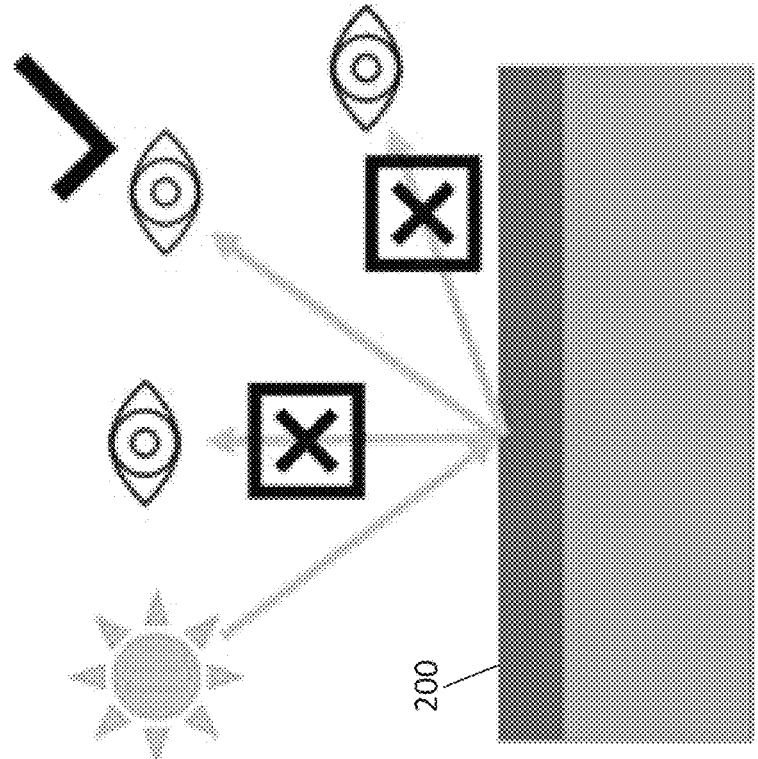

FIG. 6 illustrates a roughening technique that may be applied before both the ablation process and/or the oxide coloring process. One of the noted features of the oxide coloration process is that the color is only seen in its full vibrancy from certain angles. Depending on application, this can be either good or bad. Because of this, the ability to control the viewing angle is desired.

Another laser may be employed to roughen the surface of the part 200. The roughening surface may be applied any time prior to the oxide coloring process. The roughening process alters the viewing angle of the final colorized part. As shown in FIG. 6, roughening the surface of part 200 provides edges 231 that have different angles with respect to the viewer. The light source reflecting off of the surface of an oxide colored part. As illustrated by theoretical view points (eyes) show the angles that perceive the mark in its full color by angle and demonstrates how roughened texture causes increased viewing angles. In one alternative, the surface of the part 200 may be roughened mechanically before the PVD finish 203 is applied.

In one implementation, oxygen concentration (chamber property) was modified to determine the impact of oxygen concentration on the oxide coloring process. A rubber tube was connected to an oxygen bottle which was positioned to deliver pure oxygen gas directly to where the laser process was occurring. A significant color change was noted. This process could be used to control the color, improve film performance, or to make other changes. It is also likely that moving air, whether from a vacuum or compressed air, would likely have an effect on the process.

In one implementation, pure chromium plating was used. The results showed that the sample produced only black, green, and red colors and that the colors were very "powdery". The colors seen may be oxides of chromium ($CrO_2$ is black, $Cr_2O_3$ is green, and the spinel group compound $CrCr_2O_4$ is red).

In each of the embodiments described herein, another factor in the colorizing process may be temperature. The growth of the colored oxide 209 on the surface of part 250 is a chemical reaction. Like most chemical reactions, the result of the reaction (the color for this process) is affected by the temperature that the reaction is occurring at. During the laser coloring process, heat can build up in the part 250 being colored due to the laser radiation impinging on the surface. If this heat is not removed, the final color can vary. The part 250 can be attached to thermally conductive fixturing that has water or another fluid flowing through it. This fluid may be thermally controlled to a set temperature and would allow for the removal of excess heat in the part 250 caused by the laser from the part 250, keeping the part temperature uniform. Keeping the temperature uniform during the process improves the uniformity of color resulting from the process.

Figure 7:
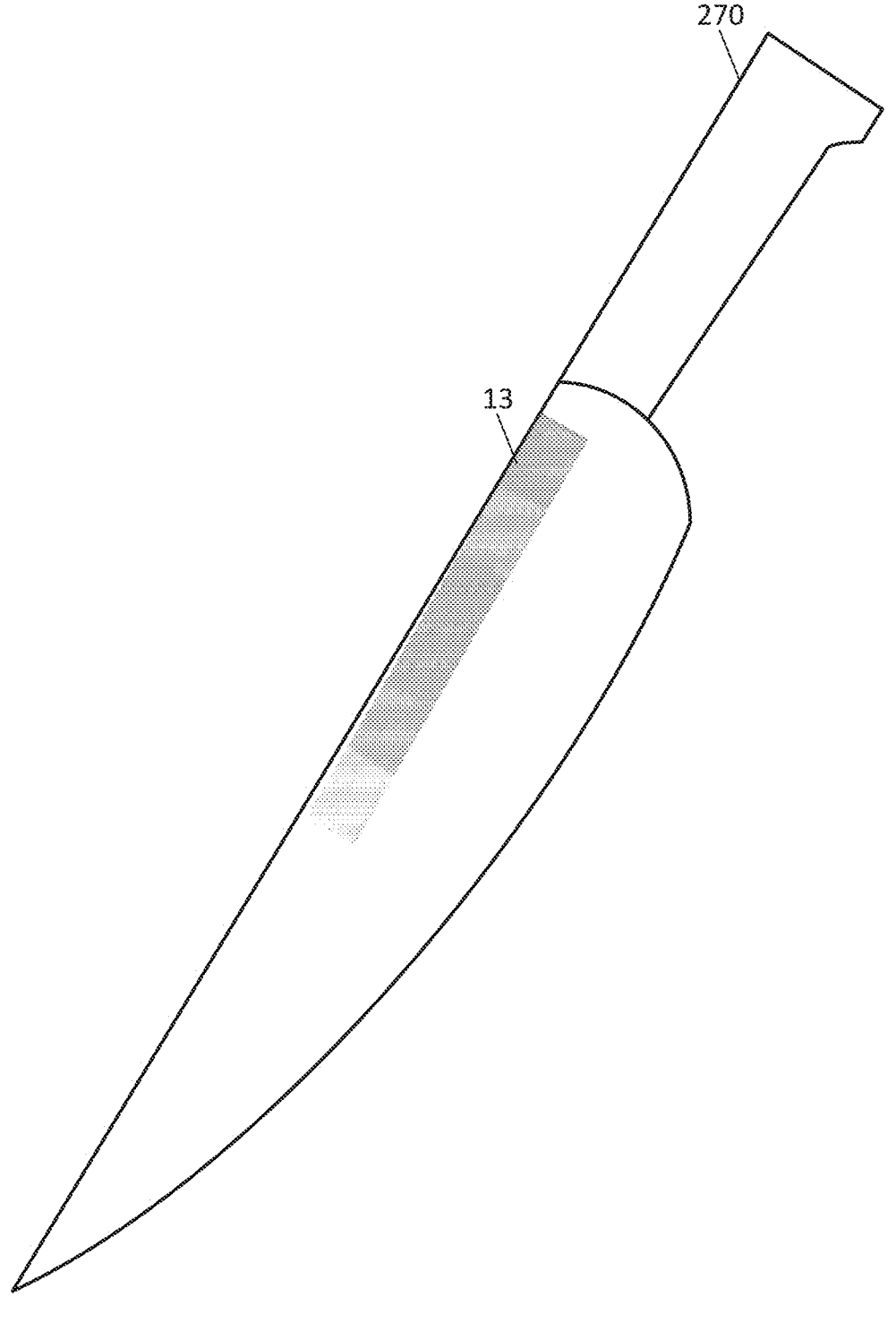
FIG. 7 illustrates an example utensil including the example oxide colorization.

FIG. 7 illustrates an example utensil such as knife 270 including the colored indicia 13 including one or more colors from the palette. The knife 270 may be manufactured through forging, casting, or another technique. Other example utensils may include forks, spoons, spatulas, tongs, or others. Other devices such as pots, pans, toasters, measuring cups may include the colored indicia 13.

The knife 270 or other device may include a substrate or other outer surface including stainless steel or another material. A chrome plating may be deposited on the substrate using electroplating, electrochemical deposition, or electrodeposition. The specialty PVD finish may be placed over the chrome plating using PVD. The specialty PVD finish includes at least two metals (e.g., zirconium and chromium) or four metals (zirconium, chromium, titanium, and hafnium). Additional, different, or fewer components or techniques may be included.

Figure 8:
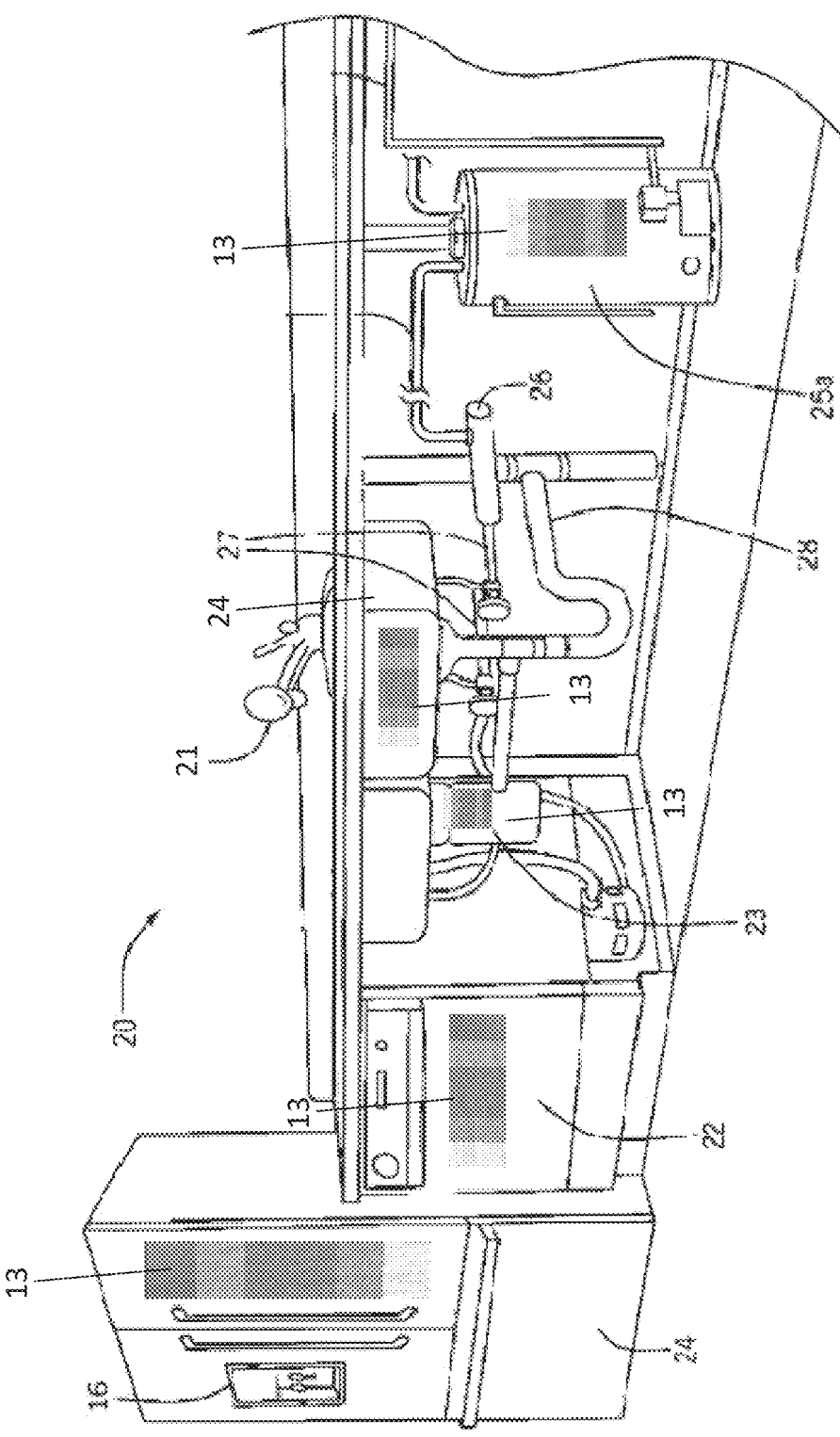
FIG. 8 illustrates example kitchen devices including the example oxide colorization.
Figure 9:
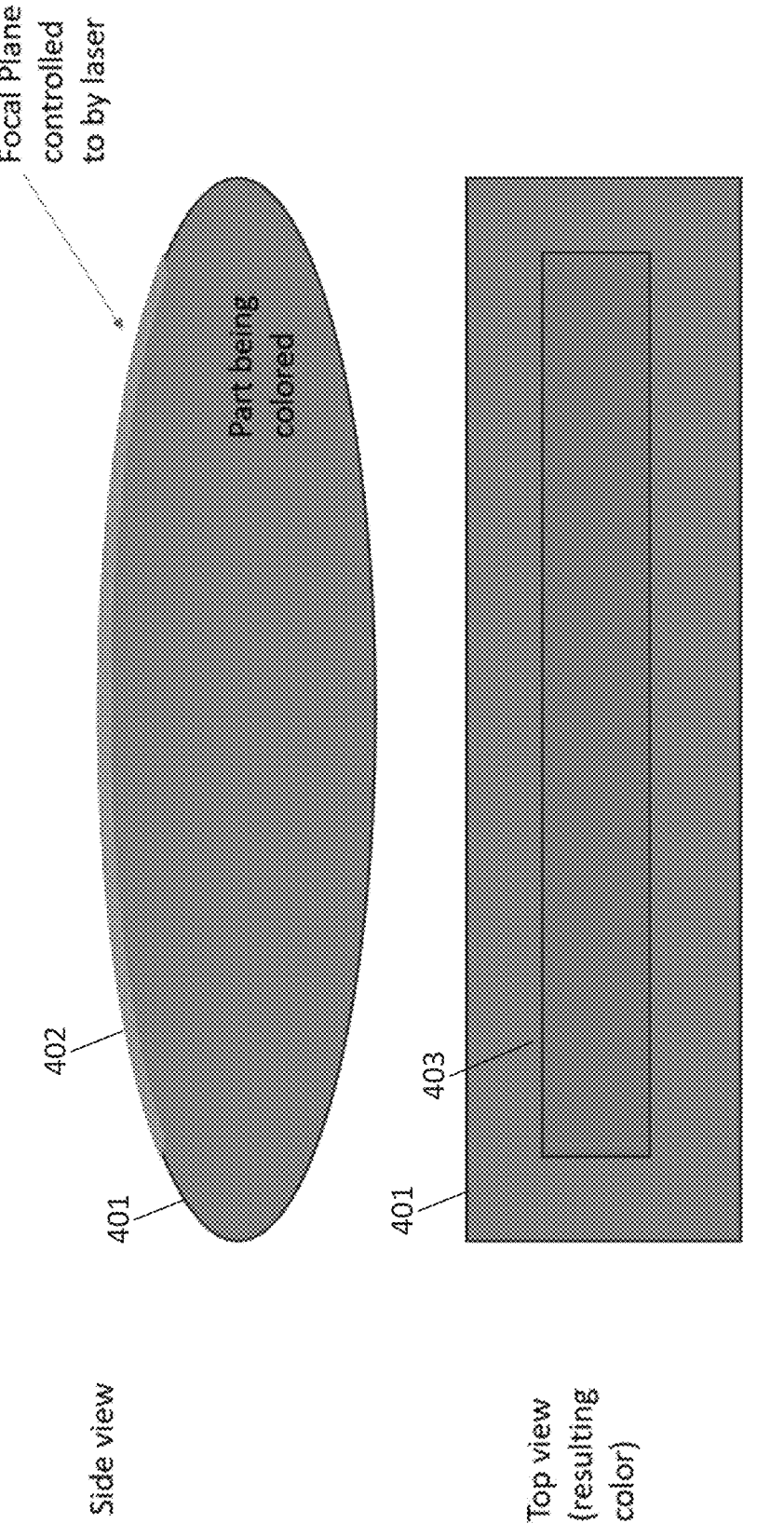
FIGS. 9-12 illustrate a variable focal length for a laser used in the oxide colorization technique.

FIG. 8 illustrates an example kitchen setting 20 including multiple appliances such as a kitchen faucet 21, a dishwasher 22, a garbage disposal 23, a refrigerator 24, a water heater 25, and a water filter 26. Each of the kitchen devices may be connected to a water supply 27 and a drain 28. Each of the kitchen devices may include a colored indicia 13 according to any of the examples herein.

The kitchen faucet 21 may be configured to dispense water from the water supply 27. The dishwasher 22 may provide various washing cycles for washing dishes. The washing cycle may include a predetermined pattern of washing cycles, a predetermined type of washing pattern (e.g., gentle cycle, pots and pans, sanitize, extra heat, steam), a temperature setting, a turbidity setting, a water volume setting, or another setting. The garbage disposal 23 may include a garburator or cutting blades for cutting food wastes or other material into small pieces for passing through plumbing. The garbage disposal 23 may be mounted in line between the drain of the sink and the trap of the plumbing. The garbage disposal 23 may include a timing setting for an amount of time for the garbage disposal 23 to run. The refrigerator 24 may include a refrigerator compartment that provide refrigerated storage for food and/or a freezer compartment that provides low temperature storage for food. The water heater 25*a* may provide heated water to the other appliances. The water heater 25 may include a temperature setting that describes the target temperature for the water in the water heater. The water heater 25 may include a volume setting that defines an amount of water that is heated in the water heater 25. The water filter 26 may filter water before the water is provided to any of the other kitchen devices. The water filter 26 may include various settings including filtering modes that target particular contaminants. For example, the water filter 26 may include a lead filtering mode which may target removing lead from the water, a bacteria filtering mode which may target removing bacteria from the water, or specific particulate filtering mode for removing a specific particulate from the water. The water filter 26 may include a flow sensor configured to measure a flow of water in or out of the water filter 26, which is transmitted to the control center controller.

FIGS. 9-12 illustrate a variable focal length for a laser used in the oxide colorization technique. By way of introduction, FIG. 9 includes a part 401 that is curved. In order to maintain uniform intensity on the curved surface, the laser includes a lens that is configured to move a focal point. Over time, the focal point defines focal place 402. By moving the focal point, the laser can property track the curved surface. A solid patch 403 of color results from the focal point moved to follow the contour of the part 401.

If the focal was not changed, different colors on the curved part 401 would result. Similarly, if the part was flat (or a different shape), but the varying focal length was still used, different colors would result. In this way, the focal point of the laser is controlled to create a gradient in the resulting colors. If the focal point of the laser is moved towards or away from the surface of the substrate, the color that is produced changes.

Figure 10:
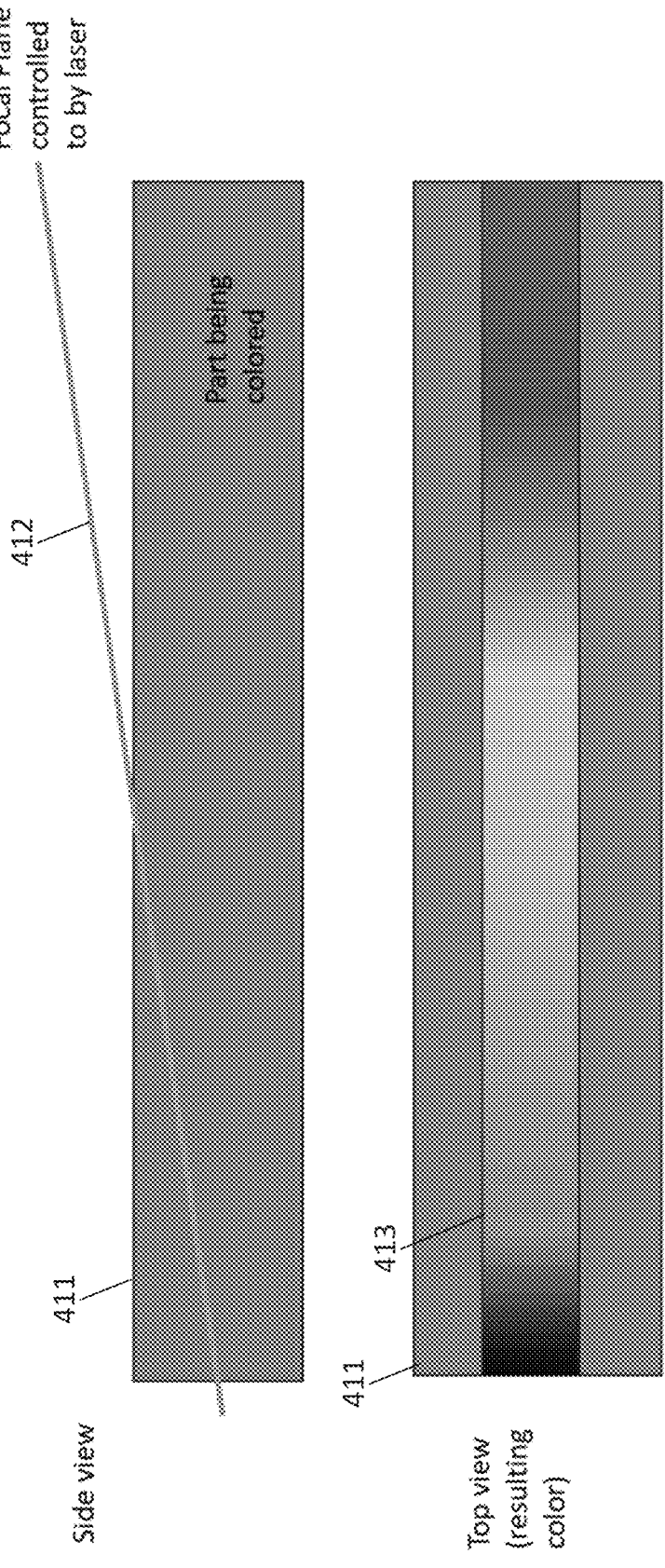

FIG. 10 illustrates a part 411 as flat surface with an applied laser having a linearly changing focal plane 412. The resulting color patch 413 is a gradient where the color changes as a function of the focal length.

Figure 11:
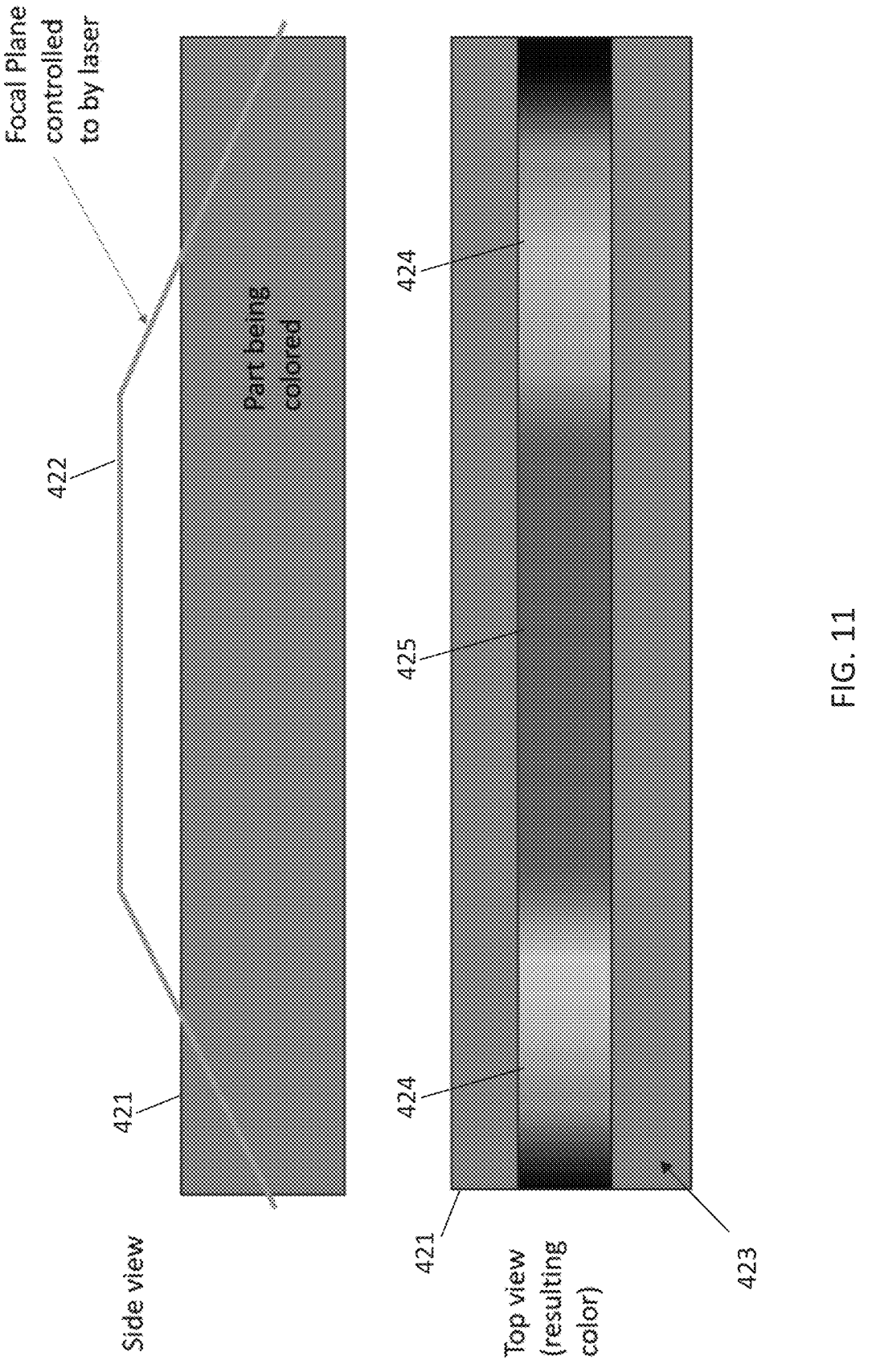

FIG. 11 illustrates a part 421 with a flat surface with an applied laser having a changing focal plane 412 such that the focal point decreases to a predetermine level for a prede-termined time and then increases again. The resulting color patch 423 includes a first color range 424, changes to a second color range 425, and then returns to the first color range 424. The change in color is proportional or a function of the focal points in the focal plane 422.

Figure 12:
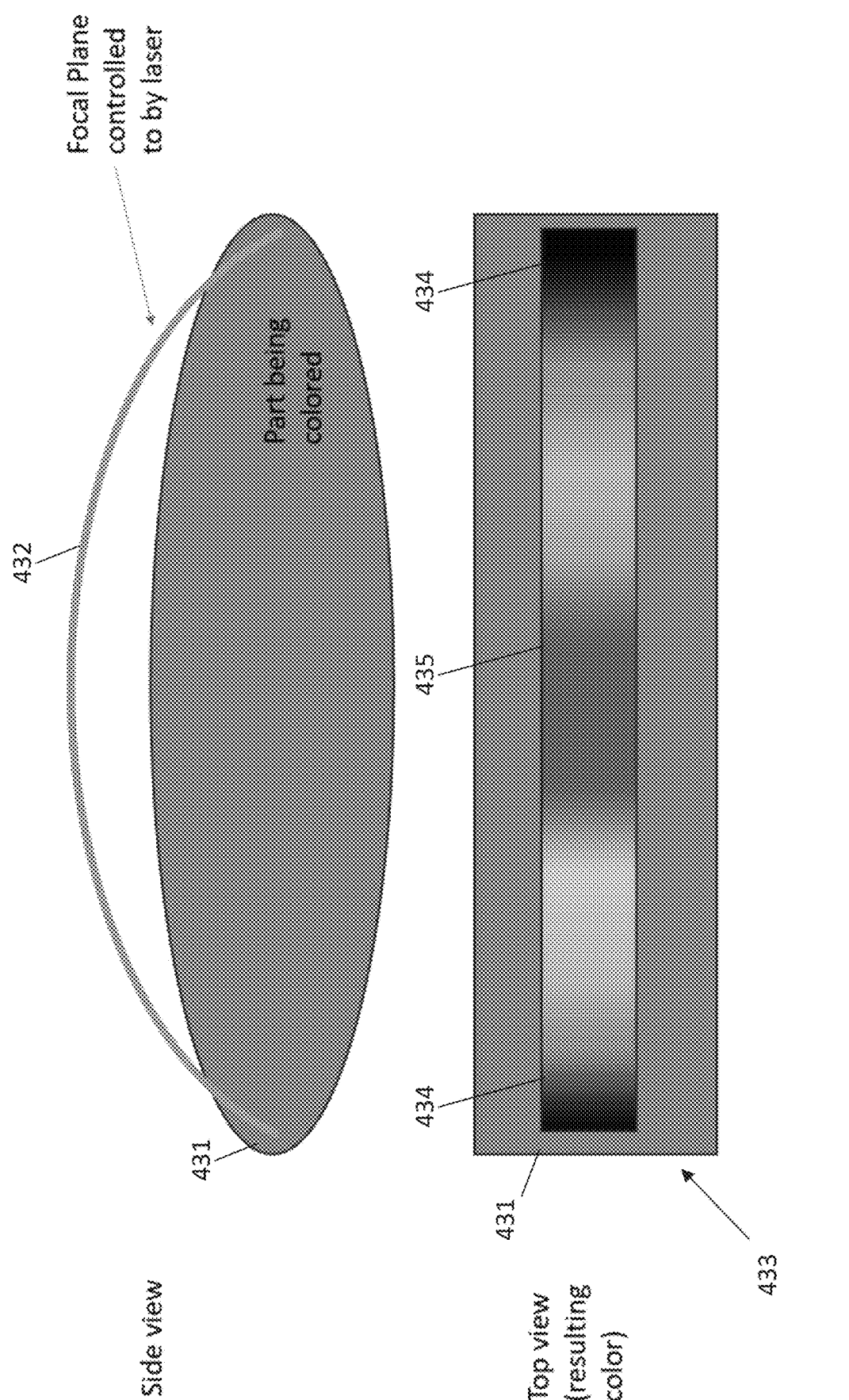

FIG. 12 illustrates a part 431 with a curved surface with an applied laser having a changing focal plane 432 that is different than the curved surface. The radius of curvature of the part 431 is different than the radius of curvature of the focal plane 432. When the radius of curvature of the part 431 is greater than the radius of curvature of the focal plane 432, a first color pattern results. When the radius of curvature of the part 431 is less than the radius of curvature of the focal plane 432, a second color pattern results. Different shapes may be used. One or more shapes for the focal plane may be selected to generate a predetermined image with any level of detail. The resulting color patch 433 includes a first color range 434, changes to a second color range 435, and then returns to the first color range 434.

Figure 13:
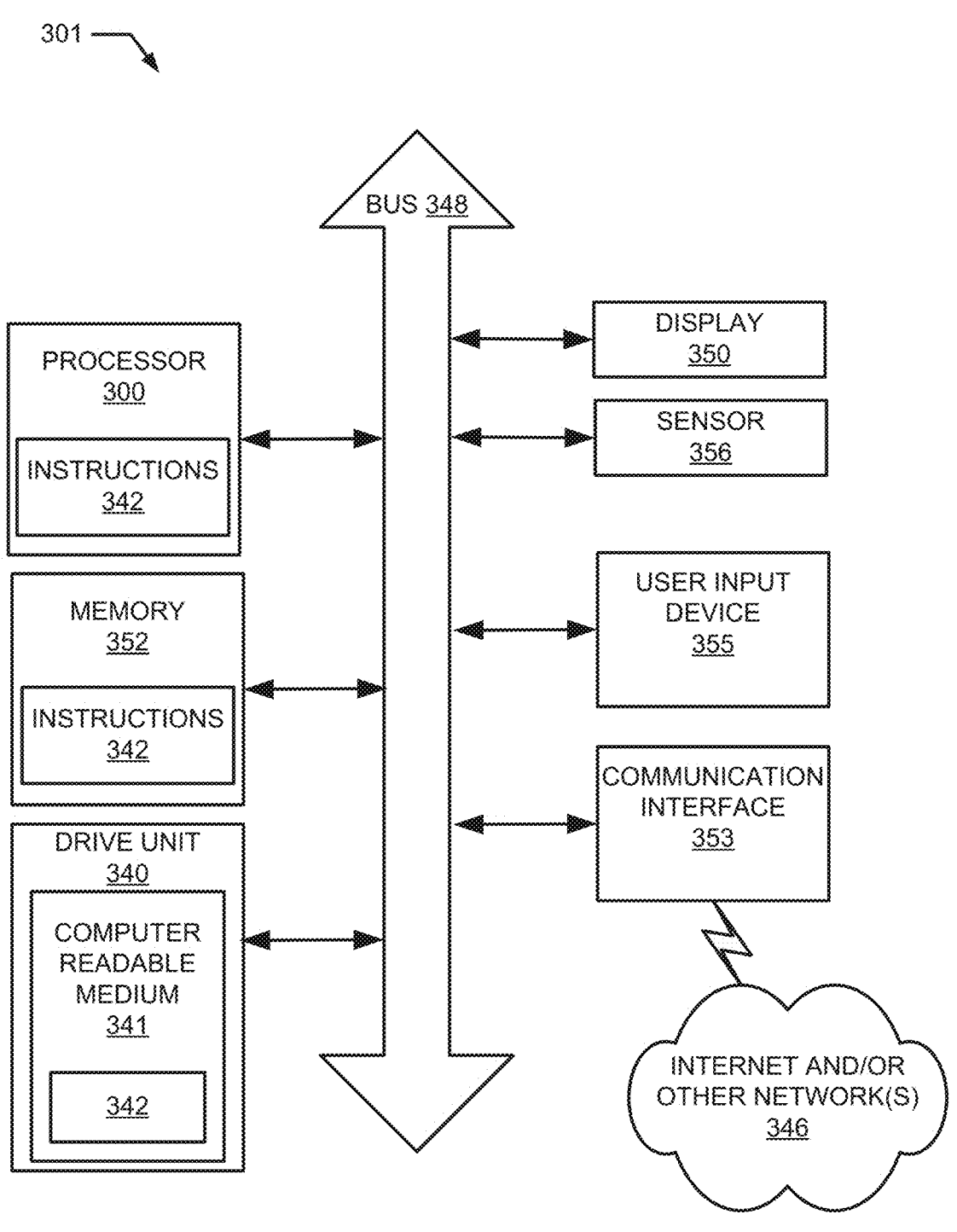
FIG. 13 illustrates an example controller for the laser or other devices for the oxide colorization technique.

FIG. 13 illustrates an example microprocessor implemen-tation of a laser controller configured to provide commands for a first laser process (ablation, laser 221), a second laser process (oxide creation, laser 211), and a third laser process (roughening). These laser process may occur in various orders such as third, first, second. In some examples the controller 301 including processor 300 implements the laser control. The controller 301 may include a processor 300, a memory 352, and a communication interface 353 for inter-facing with devices or to the internet and/or other networks 346. In addition to the communication interface 353, a sensor interface may be configured to receive data from sensors (e.g., position sensors for feedback of laser position, optical sensors for feedback on the roughening, ablation, or oxide creation processes).

The components of the control system may communicate using bus 348. The control system may be connected to a workstation or another external device (e.g., control panel) and/or a database for receiving user inputs, system charac-teristics, and any of the values described herein.

Optionally, the control system may include an input device 355 and/or a sensing circuit 356 in communication with any of the sensors. The sensing circuit receives sensor measurements from sensors as described above. The input device may include any of the user inputs such as buttons, touchscreen, a keyboard, a microphone for voice inputs, a camera for gesture inputs, and/or another mechanism.

Optionally, the control system may include a drive unit 340 for receiving and reading non-transitory computer media 341 having instructions 342. Additional, different, or fewer components may be included. The processor 300 is configured to perform instructions 342 stored in memory 352 for executing the algorithms described herein. A display 350 may be an indicator or other screen output device. The display 350 may be combined with the user input device 355.

Figure 14:
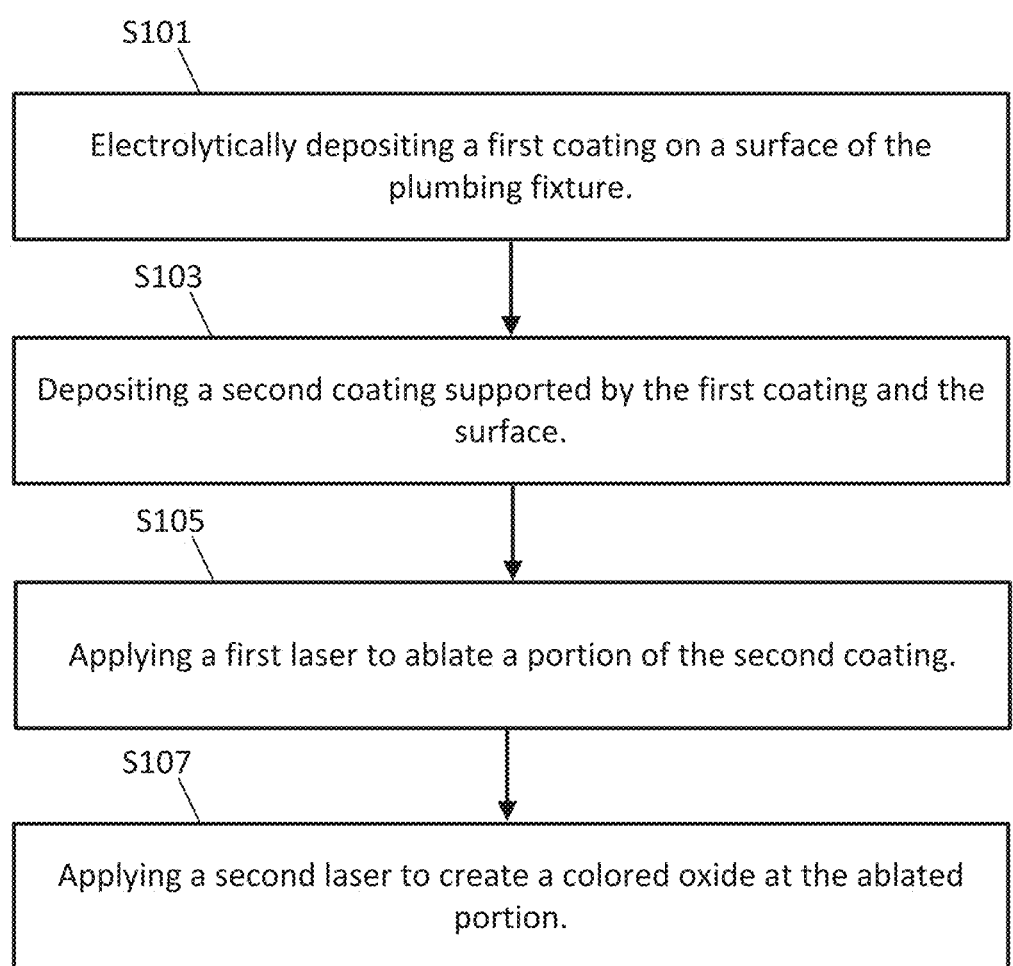
FIG. 14 illustrates a flow chart for the apparatus of FIG. 13.

FIG. 14 illustrates a flow chart for the apparatus of FIG. 13. The acts of the flow chart may be performed by the controller 301. Additional, different of fewer acts may be included.

At act S101, the controller 301 (e.g., processor 300) sends a command to electrolytically deposit a first coating on a surface of a plumbing fixture or other device. The command may be received at an electrode to provide an electric current to plate the first coating on the surface of the plumbing fixture or other device.

At act S103, the controller 301 (e.g., processor 300) sends a command to deposit a second coating supported by the first coating and the surface of the plumbing fixture. The com-mand may be received at a PVD device to apply the specialty PVD finish as the second coating as described herein. The PVD finish may include at least two metals from a group including zirconium, chromium, titanium, and haf-nium.

The PVD device may include a charged device configured to generate an electric arc discharged at the surface so that ionized vapor to be deposited onto the surface. The PVD device may include an electron beam generator to place the specialty PVD finish via electron bombardment. The PVD device may include a high-power laser ablates material into a vapor.

At act S105, the controller 301 (e.g., processor 300) sends a command to apply a first laser to ablate a portion of the second coating. Ablation is optional. The first laser may follow a variable focal length pattern selected according to an image stored in the memory 352. The controller 301 may determine focal lengths according to image properties of the image stored in the memory 352. The focal lengths may also be adjusted according to the shape of the part to be colored.

At act S107, the controller 301 (e.g., processor 300) sends a command to apply a second laser to create a colored oxide at the ablated portion or specified portion with ablation is omitted. The second laser may follow a variable focal length pattern selected according to an image stored in the memory 352. The controller 301 may determine focal lengths accord-ing to image properties of the image stored in the memory 352. The focal lengths may also be adjusted according to the shape of the part to be colored.

Processor 300 may be a general purpose or specific purpose processor, an application specific integrated circuit (ASIC), one or more programmable logic controllers (PLCs), one or more field programmable gate arrays (FP-GAs), a group of processing components, or other suitable processing components. Processor 300 is configured to execute computer code or instructions stored in memory 352 or received from other computer readable media (e.g., embedded flash memory, local hard disk storage, local ROM, network storage, a remote server, etc.). The processor 300 may be a single device or combinations of devices, such as associated with a network, distributed processing, or cloud computing.

Memory 352 may include one or more devices (e.g., memory units, memory devices, storage devices, etc.) for storing data and/or computer code for completing and/or facilitating the various processes described in the present disclosure. Memory 352 may include random access memory (RAM), read-only memory (ROM), hard drive storage, temporary storage, non-volatile memory, flash memory, optical memory, or any other suitable memory for storing software objects and/or computer instructions. Memory 352 may include database components, object code components, script components, or any other type of information structure for supporting the various activities and information structures described in the present disclosure. Memory 352 may be communicably connected to processor 300 via a processing circuit and may include computer code for executing (e.g., by processor 300) one or more processes described herein. For example, memory 298 may include graphics, web pages, HTML files, XML files, script code, shower configuration files, or other resources for use in generating graphical user interfaces for display and/or for use in interpreting user interface inputs to make command, control, or communication decisions.

In addition to ingress ports and egress ports, the communication interface 353 may include any operable connection. An operable connection may be one in which signals, physical communications, and/or logical communications may be sent and/or received. An operable connection may include a physical interface, an electrical interface, and/or a data interface. The communication interface 353 may be connected to a network. The network may include wired networks (e.g., Ethernet), wireless networks, or combinations thereof. The wireless network may be a cellular telephone network, an 802.11, 802.16, 802.20, or WiMax network, a Bluetooth pairing of devices, or a Bluetooth mesh network. Further, the network may be a public network, such as the Internet, a private network, such as an intranet, or combinations thereof, and may utilize a variety of networking protocols now available or later developed including, but not limited to TCP/IP based networking protocols.

While the computer-readable medium (e.g., memory 352) is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored. The computer-readable medium may be non-transitory, which includes all tangible computer-readable media.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

While this specification contains many specifics, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

It is intended that the foregoing detailed description be regarded as illustrative rather than limiting and that it is understood that the following claims including all equivalents are intended to define the scope of the invention. The claims should not be read as limited to the described order or elements unless stated to that effect. Therefore, all embodiments that come within the scope and spirit of the following claims and equivalents thereto are claimed as the invention.

What is claimed is:

1. A composition comprising:
a first coating electrolytically or electrolessly deposited on a surface;
a middle layer on the first coating, the middle layer comprising a coating of zirconium metal and chromium metal; and
a colored oxide in contact with at least a portion of the middle layer.

2. The composition of claim 1, further comprising:
a second coating with ablations so that the colored oxide contacts the at least the portion of the middle layer.

3. The composition of claim 2, wherein the surface is a roughened surface that alters a viewing angle of the colored oxide.

4. A fixture comprising:
at least one plumbing component;

a coating electrolytically or electrolessly deposited on the at least one plumbing component;
a middle layer on the coating, the middle layer comprising a coating of zirconium metal and chromium metal; and
a colored oxide in contact with at least a portion of the middle layer.

5. The fixture of claim 4, wherein the at least one plumbing component is a faucet, a toilet, a bathtub, a showerhead, a basin, a drain, a drain stopper, a urinal, or a flush valve.

6. The fixture of claim 4, wherein an exterior surface is roughened before or after the coating is deposited, to alter a viewing angle of the colored oxide.

7. The fixture of claim 4, further comprising:
an outer layer, wherein a portion of the outer layer is removed for the colored oxide.

8. The fixture of claim 7, wherein a first laser process removes the portion of the outer layer, and a second laser process provides the colored oxide.

9. The fixture of claim 8, wherein the first laser process or the second laser process includes a variable focal length.

* * * * *